United States Patent
Hartwell

(10) Patent No.: US 6,724,850 B1
(45) Date of Patent: Apr. 20, 2004

(54) DETERMINISTIC HARDWARE BEHAVIOR BETWEEN MULTIPLE ASYNCHRONOUS CLOCK DOMAINS THROUGH THE NOVEL USE OF A PLL

(75) Inventor: David Hartwell, Bolton, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 654 days.

(21) Appl. No.: 09/652,645

(22) Filed: Aug. 31, 2000

(51) Int. Cl.$^7$ .......................... G06F 11/00; G06F 13/00; H03D 3/24
(52) U.S. Cl. .......................... 375/376; 714/11; 395/550
(58) Field of Search .............................. 377/54; 714/11, 714/31; 713/503; 327/147, 12, 115; 395/550; 769/400; 375/110, 376; 745/31; 331/65

(56) References Cited

U.S. PATENT DOCUMENTS

| | | | |
|---|---|---|---|
| 5,434,996 A | * | 7/1995 | Bell ............................ 713/400 |
| 6,172,540 B1 | * | 1/2001 | Gandhi ........................ 327/145 |
| 6,268,749 B1 | * | 7/2001 | Fisch et al. .................. 327/147 |
| 6,349,391 B1 | * | 2/2002 | Petivan et al. ................ 714/11 |
| 6,448,820 B1 | * | 9/2002 | Wang et al. ................... 327/12 |

OTHER PUBLICATIONS

Jens Rennert, Clock domain Modeling is essential in high density SoC design, EETimes, Jun. 6, 2003.*
Michael Crews and Yong Yuenyongsgool, Practical design for transferring signals between clock domains, EDN, Feb. 20, 2003.*
Excerpts of PCI specification.
Excerpts of PCI–X specification.

* cited by examiner

Primary Examiner—Stephen Chin
Assistant Examiner—Cicely Ware

(57) ABSTRACT

A phase-locked loop (PLL) circuit is used to synchronize data transfers between a fast clock and a slow clock domain. The data transfer can be deterministic, where the fast clocks are generated by a first PLL and the slow clocks are generated by a second PLL. The second PLL is used to create a phase relationship between the first PLL output clock and a third PLL output clock. The phase relationship can provide for a deterministic data transfer.

14 Claims, 11 Drawing Sheets

FAST-TO-SLOW 3:2 TIMING DIAGRAM

DETERMINISTIC HARDWARE BEHAVIOR BETWEEN MULTIPLE ASYNCHRONOUS CLOCK DOMAINS THROUGH THE NOVEL USE OF A PLL

INCORPORATION BY REFERENCE OF RELATED APPLICATIONS

U.S. patent application Ser. No. 09/652,644 entitled ADAPTIVE DATA PREFETCH PREDICTION ALGORITHM;

U.S. patent application Ser. No. 09/653,133 entitled UNIQUE METHOD OF REDUCING LOSSES IN CIRCUITS USING $V^2$ PWM CONTROL;

U.S. patent application Ser. No. 09/652,641 entitled IO SPEED AND LENGTH PROGRAMMABLE WITH BUS POPULATION;

U.S. patent application Ser. No. 09/653,180 entitled PARTITION CONFIGURATION VIA SEPARATE MICROPROCESSORS;

U.S. patent application Ser. No. 09/944,517 entitled SYSTEM AND METHOD FOR INCREASING THE COUNT OF OUTSTANDING SPLIT TRANSACTIONS, U.S. patent application Ser. No. 09/652,984 entitled SYSTEM AND METHOD FOR PROVIDING FORWARD PROGRESS AND AVOIDING STARVATION AND LIVELOCK IN A MULTIPROCESSOR COMPUTER SYSTEM;

U.S. patent application Ser. No. 09/653,180 entitled ONLINE ADD/REMOVAL OF SERVER MANAGEMENT INFRASTRUCTURE, U.S. patent application Ser. No. 09/652,494 entitled AUTOMATED BACKPLANE CABLE CONNECTION IDENTIFICATION SYSTEM AND METHOD;

U.S. patent application Ser. No. 09/652,459 entitled CLOCK FORWARDING DATA RECOVERY;

U.S. patent application Ser. No. 09/652,980 entitled CLOCK FORWARD INITIALIZATION AND RESET SIGNALING TECHNIQUE;

U.S. patent application Ser. No. 09/944,515 entitled PASSIVE RELEASE AVOIDANCE TECHNIQUE;

U.S. patent application Ser. No. 09/652,985 entitled COHERENT TRANSLATION LOOK-ASIDE BUFFER; and U.S. patent application Ser. No. 09/655,171 entitled VIRTUAL TIME OF YEAR CLOCK.

BACKGROUND OF THE INVENTION

1. Field of the Invention

The present invention relates to data processing systems and, in particular, to passing data between two or more clock domains operating asynchronously.

2. Background Information

Due to the various speeds in which the various devices and circuits within a data processing system operate, it is desirable to provide several clock domains to accommodate for these differences in speeds. For instance, with the advancement of semiconductor architectures and manufacturing techniques, the speed of the semiconductor components, such as the processing unit, is ever increasing. However, such may not be the case with various input/output (I/O) devices that are used in the system. For instance, these devices may be connected to a Peripheral Computer Interconnect (PCI) bus that operates at 33/66 Megahertz (MHz), and in the case of the PCI-X bus, it operates at 66/100/133 MHz. The processing unit that communicates with these devices, in turn, may be operating at much higher speeds outpacing their operating speeds. In these instances, it is desirable to divide the system into several clock domains according to the clock speeds. However, there are many instances in which data is passed from one clock domain to another. Because the two clock domains are operating at independent or different speeds, it is important that data is passed from one domain to another without loss and with mininal delays.

Similar problems exist even within a semiconductor component itself. For instance, due to higher integration technologies, cost reduction benefits and/or reliability of the system, there are many instances in which multiple circuits requiring different operating clock speeds are etched onto a single piece of silicon. In other instances, the nature of the semiconductor component itself demands that the component operates in multiple clock domains. Take for example, an I/O bridge that connects one or more industry standard buses, like the PCI/PCI-X bus, to the processor or the processor bus. This I/O bridge may be divided into two sections. The first section interfaces with the processor/processor bus while the second section interfaces with the industry standard buses. It is desirable for the first section to operate at high clock frequencies that are compatible with the processor/processor bus while the second section operates at the lower clock frequencies that are compatible with the industry standard buses. This configuration allows for low latency and high data bandwidth to be maintained at the first section while multiple industry standard busses are operating simultaneously at independent frequencies that may be the same or different. However, data needs to be passed between the two sections.

There are also instances in which it is desired to operate the processing system with a deterministic behavior. Deterministic behavior is where a transaction, such as a transfer of data from an I/O device to memory, is deterministic. That is, its behavior at each cycle of a transaction can be duplicated by a similar processing system operating independently when presented with a common stimulus. However, when data is being passed between multiple asynchronous clock domains within a processing system, in particular, at high clock speeds, a synchronizer of one processing system may pass data at a different clock cycle from that passed by a synchronizer in another processing system. In these instances, the two processing systems are not operating in a deterministic manner and thus may lead to undesired consequences for applications relying on the deterministic behavior of the processing system.

SUMMARY OF THE INVENTION

One or more phase-locked loop circuits (PLLs) are used to facilitate the passing of data between multiple asynchronous domains. According to an embodiment of the invention, a first PLL (PLL-1) supplies a fast clock that is used by the circuits in the fast clock domain. The clock that feeds the PLL-1 also feeds a second PLL (PLL-2) that generates a "master" slow clock, which is used in the slow clock domain and is a ratio of frequency to the fast clock. The master slow clock is used to feed the circuits and/or one or more PLLs in the slow clock domain. For ease of explaining the invention, only one of the PLLs in the slow clock domain will be used and will be referred to as a third PLL (PLL-3). The output clock of PLL-2 is placed in a locked phase and a known clock edge relationship with the output clock of PLL-1. Further, the clock of PLL-3 is in a locked phase and a known clock edge relationship with PLL-1 because PLL-2 provides the reference clock to PLL-3. In sum, PLL-1, PLL-2 and PLL-3 are in locked phase; i.e., in a known phase and edge relationship. For data to cross the clock domains deterministically, data is allowed to cross on common clock edges, that is, when the rising edges of the fast and slow clocks coincide. This alignment is predicted by a fast clock state machine and a slow clock state machine, which generates a fast-to-slow clock domain signal and a slow-to-fast clock domain signal respectively, in which data is permitted to pass between the two clock domains.

BRIEF DESCRIPTION OF THE DRAWINGS

The above and further advantages of the invention may be better understood by referring to the following description in conjunction with the accompanying drawings, in which like reference numbers indicated identical or functionally similar elements.

DETAILED DESCRIPTION OF AN ILLUSTRATIVE EMBODIMENT

Figure 1:
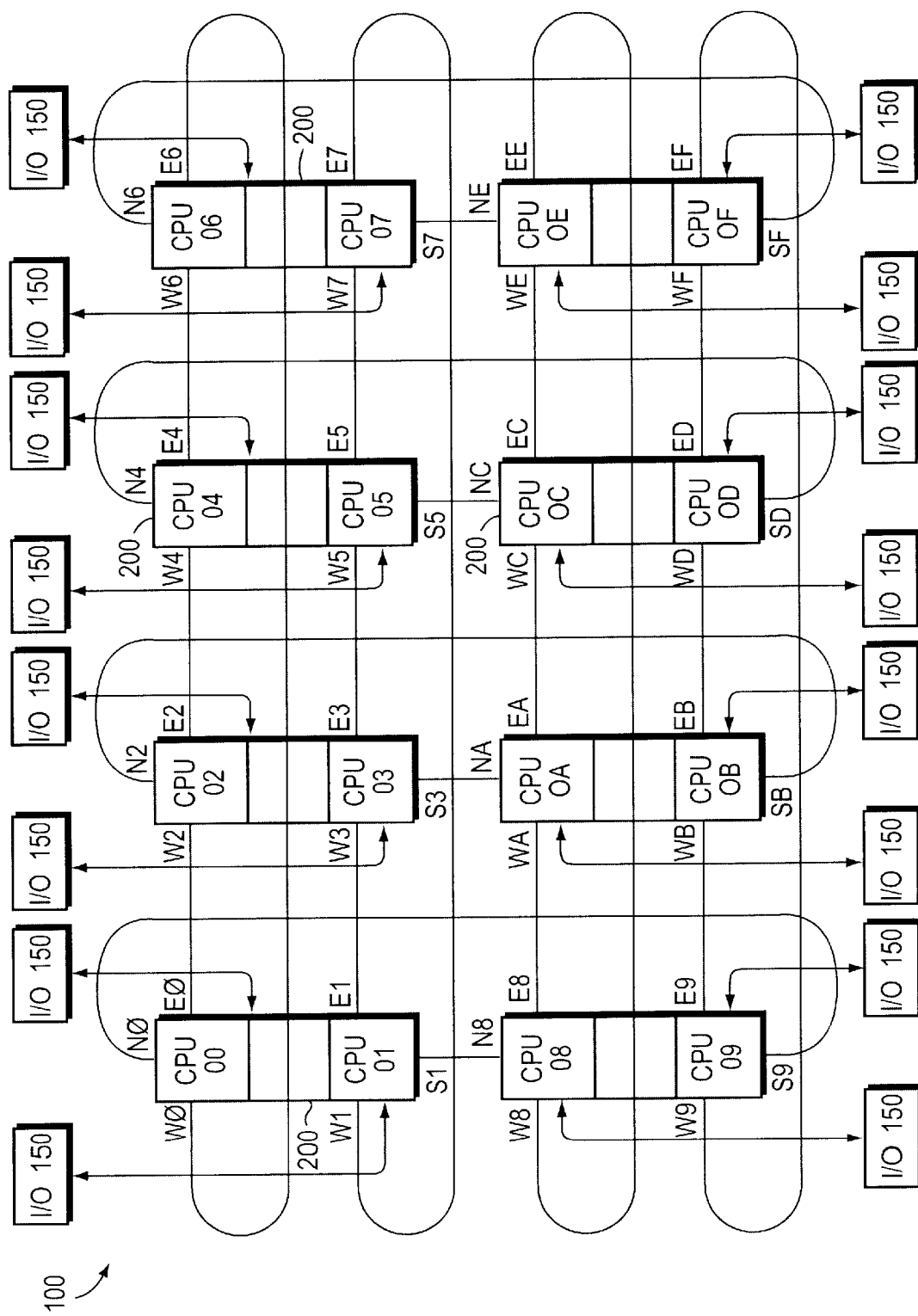
FIG. 1 is a schematic block diagram of a symmetrical multiprocessor (SMP) system comprising a plurality of dual processor (2P) modules interconnected to form a two dimensional (2D)-torus mesh configuration.

FIG. 1 is a schematic block diagram of a data processing system 100 that may be advantageously used with the present invention. In the illustrative embodiment, the data processing system is preferably a symmetrical multiprocessor (SMP) system 100 comprising a plurality of processor modules 200 interconnected to form a two dimensional (2D)-torus mesh configuration. Each processor module 200 comprises two central processing units (CPUs) with connections for two input/output (I/O) ports along with 6 interprocessor (IP) network ports. The network ports are preferably referred to as North (N), South (S), East (E) and West (W) compass points, wherein the North-South (NS) and East-West (EW) compass point connections create a (manhattan) grid. Additionally, the outside ends of the mesh wrap-around and connect to each other. I/O traffic enters the 2D torus via I/O channel connections between the CPUs and I/O subsystem 150. Each compass point is coupled to an IP channel that comprises 2 unidirectional, clock forwarded links.

Figure 2:
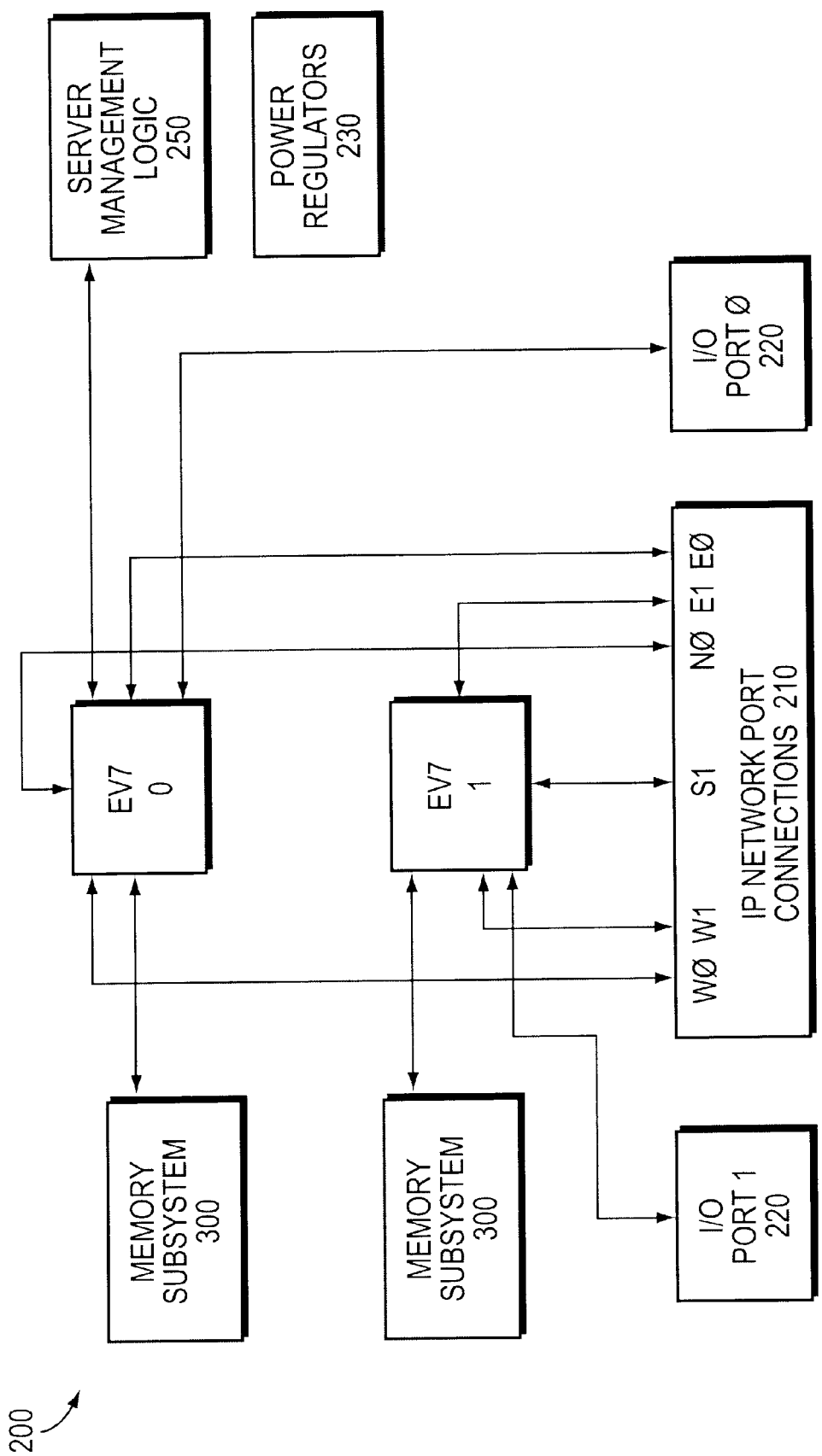
FIG. 2 is a schematic block diagram of a 2P module of FIG. 1.

FIG. 2 is a schematic block diagram of the processor (2P) module 200. As noted, the 2P module 200 comprises 2 CPUs with connections 210 for the IP ("compass") network ports and an I/O port 220 associated with each CPU. The 2P module 200 also includes power regulators 230, system management logic 250 and memory subsystem 300 coupled to memory ports of each CPU. The system management logic 250 cooperates with a server management system to control functions of the SMP system. Each of the N, S, E and W compass points, along with the I/O and memory ports use clock-forwarding, i.e., forwarding clock signals with the data signals, to increase data transfer rates and reduce skew between the clock and data.

Each CPU is preferably an EV7 processor comprising an EV6 core, 2 memory controllers, an I/O port interface and 4 network ports. In the illustrative embodiment, the EV7 supports up to 256 processors and 256 IO7s. A detailed description of an IO7 is found in FIG. 5 and the corresponding text below. The EV6 core preferably incorporates a traditional reduced instruction set computer (RISC) load/store architecture. In the illustrative embodiment described herein, the EV6 cores are generally the Alpha® 21264 processor chips manufactured by Compaq Computer Corporation®, with the addition of an internal cache and CBOX, the latter providing integrated cache controller functions to the EV7 processor. However, it will be apparent to those skilled in the art that other types of processor chips may be advantageously used. The EV7 processor also includes an RBOX that provides integrated routing/networking control functions with respect to the compass points. The EV7 further includes a ZBOX that provides integrated memory controller functions for controlling the memory subsystem.

The memory subsystem 300 is preferably implemented using RAMBUS technology and, accordingly, the memory space is generally divided between 2 RAMBUS controllers. However, an EV7 processor can operate with 0, 1 or 2 RAMBUS controllers.

Figure 3:
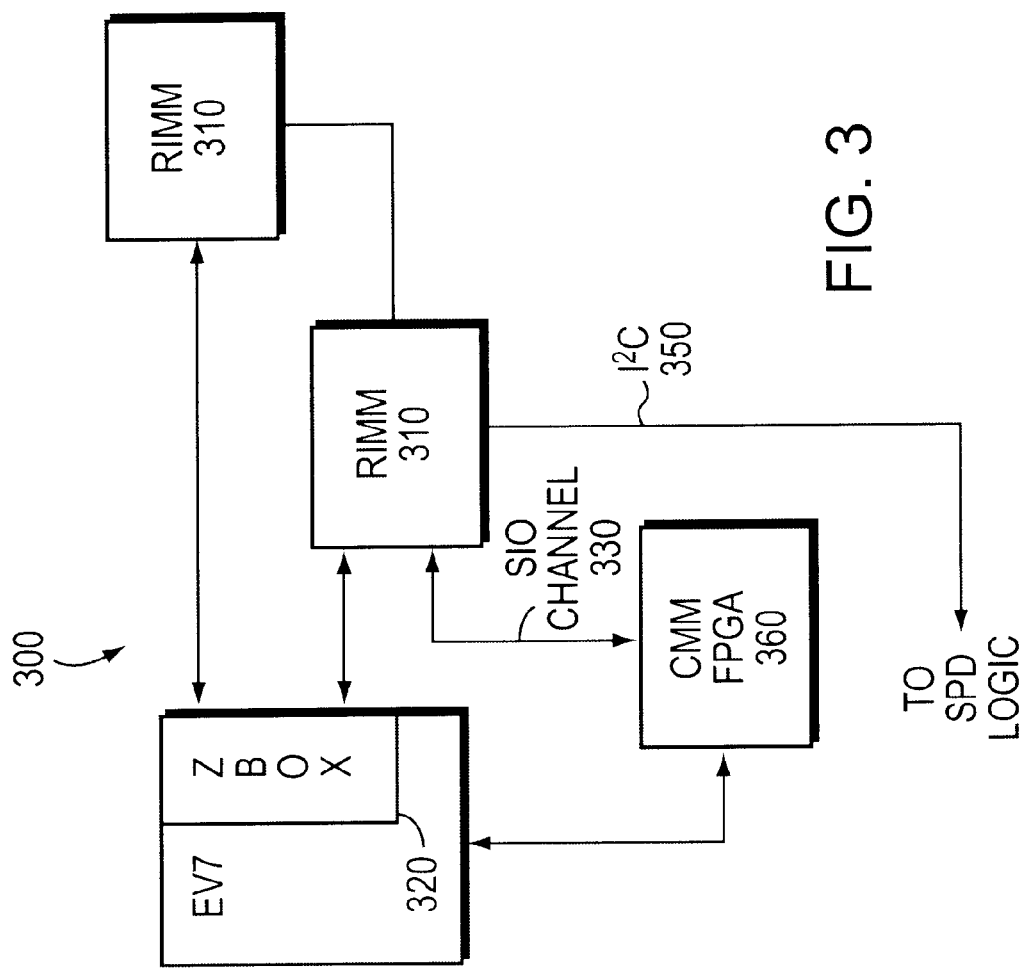
FIG. 3 is a schematic diagram of a memory subsystem of the SMP system.

FIG. 3 is a schematic diagram of the SMP memory subsystem 300 illustrating connections between the EV7 and RAMBUS memory modules (RIMMs 310). Software configures the memory controller logic (ZBOX 320) within the EV7 and the logic on each RIMM 310 before testing and initializing memory. Specifically, the memory subsystem components include 2 RAMBUS memory controllers (not shown) within the ZBOX 320, a RIMM 310 containing RDRAM memory devices, a serial I/O (SIO 330) channel to RDRAMs of the RIMMs 310, serial presence detect (SPD) logic (EEPROM data) via an I$^2$C bus 350, and a CPU management module (CMM) field programmable gate array (FPGA 360) that interfaces between a CMM (not shown) and the EV7 processor.

Figure 4:
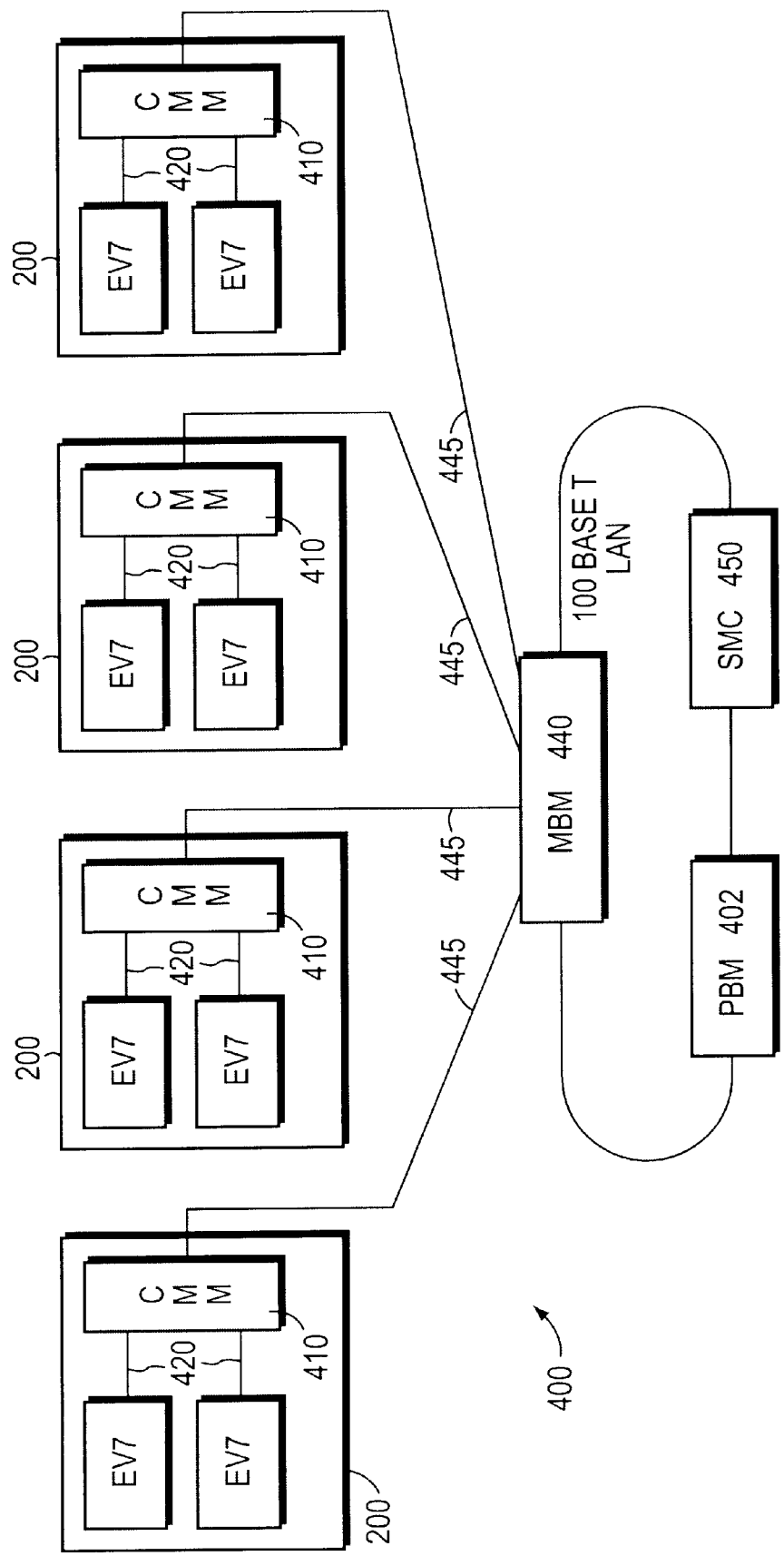
FIG. 4 is a schematic block diagram of a server management platform for the SMP system.

FIG. 4 is a schematic block diagram of the server management platform 400 for the SMP system. The server management comprises a 3-tier management scheme that is used to bring up ("boot") the SMP system. At the lowest level, each 2P module 200 has a plug-in, CPU management module (CMM 410) that provides power and initialization control for the local 2P module. The CMM also interfaces directly to both EV7 processors via serial links 420 and provides debug, initialization, error collection and communication support to a higher, intermediate level of the service management hierarchy.

The intermediate level of service management is provided by a system backplane manager (MBM) 440 contained within a CPU drawer of the SMP system. Each CMM 410 on each 2P module 200 communicates with an MBM 440 through a point-to-point serial connection 445 that is preferably implemented in etch so as to obviate the need for a cable connection. The MBM controls the overall operation of the intermediate level by functioning as the master of the CMMs. In the illustrative embodiment, each MBM controls 4 CMM devices within the CPU drawer.

The MBM 440 spawns a server manager network port that is connected to a service management LAN hub. The MBMs 440 preferably communicate with I/O backplane managers (PBM 402), the latter of which are contained in I/O drawers of the system. Communication among the server managers of the platform 400 is preferably effected via a TCP/IP protocol over a server management LAN. In the illustrative embodiment, the server management platform is implemented as a 100 base T (Ethernet) LAN, although similar types of local area network implementations, such as Token Ring or FDDI, may be advantageously used with the system.

A personal computer (PC) or similar network device connected to one of the ports of the service management LAN hub serves as a server management console (SMC 450). The SMC 450 provides the highest level of server management and, to the end, executes a platform management utility that provides a unified view of the entire SMP system for purposes of controlling the system. From a physical implementation, the MBMs, PBMs and SMC are coupled to the service management hub; however, logically they are interconnected by the LAN.

Figure 5:
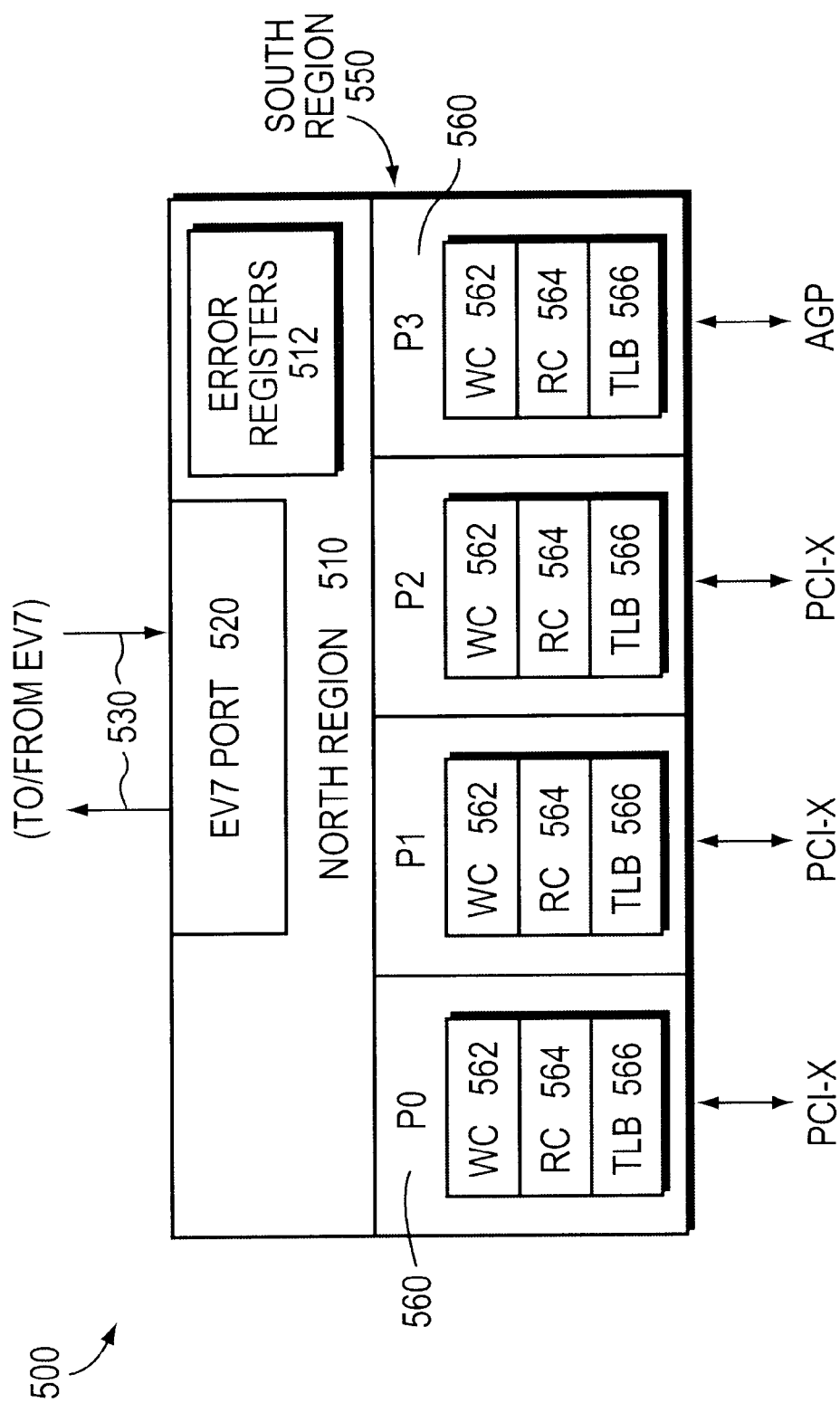
FIG. 5 is a schematic block diagram of an IO7 of an I/O subsystem of the SMP system.

FIG. 5 is a schematic block diagram of an IO7 device 500 that provides a fundamental building block for the SMP I/O subsystem 150. The IO7 is preferably implemented as an application specific integrated circuit (ASIC). Each EV7 processor supports one I/O ASIC connection; however, there is no requirement that each processor have an I/O connection. In the illustrative embodiment, the I/O subsystem 150 includes an I/O drawer (not shown) with hot-swap Peripheral Computer Interconnect (PCI)-X and Accelerated Graphics Port (AGP) support. The I/O drawer includes an IO7 plug-in card that spawns 4 I/O buses.

The IO7 500 comprises a North circuit region 510 (i.e., the I/O interface) that interfaces to the EV7 processor and a South circuit region 550 that includes a plurality of I/O ports 560 (P0–P3) that interface to industry standard I/O buses. These I/O ports will hereinafter be referred to as Southports. An EV7 port 520 of the North region 510 couples to the EV7 processor via 2 unidirectional, clock forwarded links 530. The EV7 port will hereinafter be referred to as the Northport. In the illustrative embodiment, 3 of the 4 I/O ports 560 interface to buses that operate according to, e.g., the conventional PCI-X protocol, while the 4th port interfaces to an AGP bus. The IO7 generally includes the same functionality as provided by the IOA, IOD and PCA ASICs of the AS80, AS160 and AS320 family of servers manufactured by Compaq Computer Corporation®.

Figure 6:
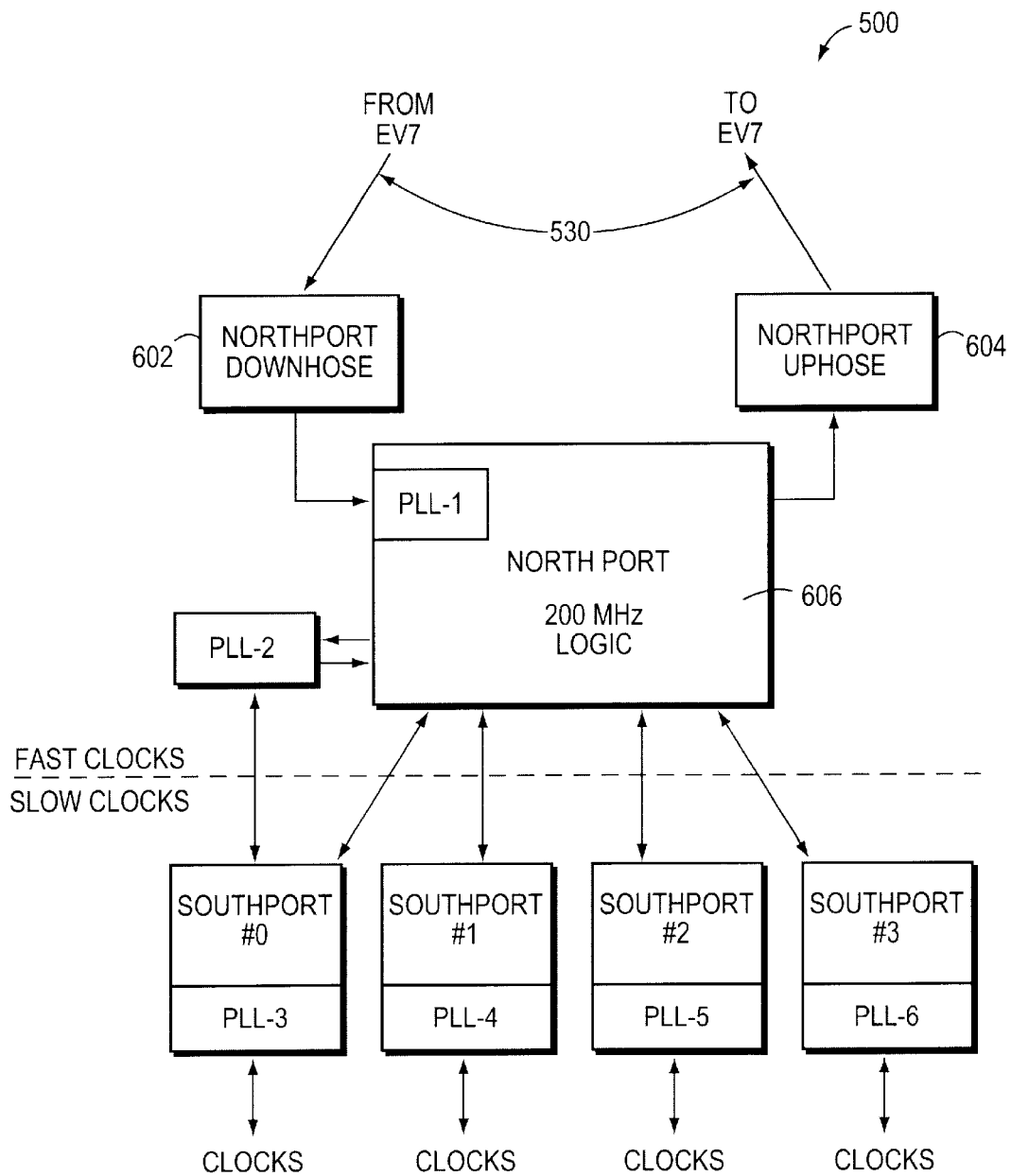
FIG. 6 is a schematic block diagram of an IO7 shown in terms of its clock domains.

FIG. 6 is a diagram of an IO7 device 500 shown in terms of its clock domains. A series of phase-locked loop circuits (PLLs) synthesize the required clock signals in the IO7 device 500. A PLL is a closed-loop frequency control circuit that performs its function by detecting the phase difference between an input clock signal and an output signal generated by a voltage controlled oscillator (VCO). In accordance with the principles of the invention, PLL-1 retrieves the forwarding clock from the Northport Downhose 602 and uses it to generate a 200 MHz clock (fast clock) that supplies all the clocks within the 200 MHz logic 606. The generated 200 MHz clock retains a fixed edge relationship (+/−skews) with the forwarding clock thereby placing the forwarding clock in a synchronous phase and edge relationship with the 200 MHz clock. This relationship also provides for the 200 MHz logic 606 to pass a forwarding clock and data upstream to the EV7 processor via the Northport Uphose 604. Accordingly, there is a bi-directional synchronous data transfer between the IO7 device and EV7 processor via the Northport.

The forwarding clock also feeds PLL-2, which uses it to generate "master" slow clock as a ratio of frequency to the fast clock. This clock, for example, may be used to supply the PCI/PCI-X clocks for the PCI/PCI-X adapters and is also used as a reference clock to the PLL-3 located in the SouthPort #0. Note that PLL-2 may also supply the clocks for PLLs in other Southports according to a desired result. The PLL-2 along with silicon wire delay and package skew matching, provides a known clock phase and a clock edge relationship between the 200 MHz logic located in the fast clock region and the 33/66/100/133 MHz PCI/PCI-X logic within the SouthPort #0 located in the slow clock domain.

In accordance with one embodiment, the PLL-1 is self-starting and operates at a correct frequency when the forwarded clock is received from the EV7 processor. The PLL-2 operational parameters may be set by software once the PLL-1 is operational. Operational parameters of the PLL are usually found in the technical manual or engineering specifications corresponding to the ASIC to which the IO7 device is preferably implemented. Once the parameters have been set, PLL-2 is released from reset via software, locks onto the input reference clock (forwarding clock) and supplies clocks to Southport #0, and PCI/PCI-X plugin adapters.

Figure 7:
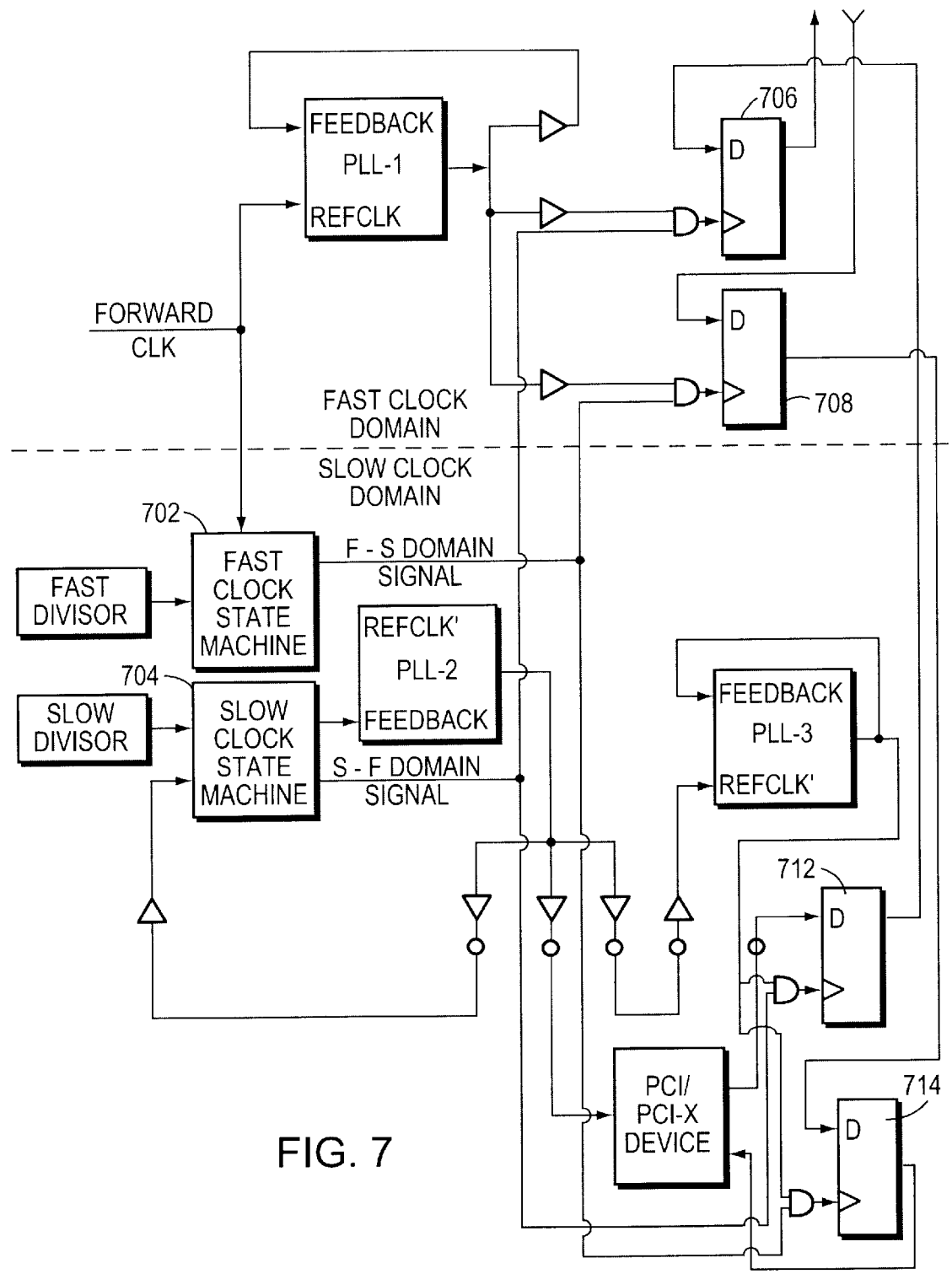
FIG. 7 is an illustrative circuitry showing a more detailed relationship between Phase-Locked Loops (PLLs) that provides for data transfer between multiple asynchronous clock domains.

Turning now to FIG. 7, an illustrative circuitry showing a more detailed relationship between the PLL-1, PLL-2 and PLL-3 is shown. From the received forwarding clock, PLL-1 generates a clock that tracks the forwarding clock in a one to one cycle relationship. The forwarding clock is also fed into the PLL-2 but is first passed through a fast clock state machine 702. Further description of the state machine 702 will be given with respect to FIG. 8, but one of its functions is to divide the forwarding clock into a reference clock input for the PLL-2. Note that to minimize the skew between PLL-1 and PLL-2, the electrical path length between the input of the forwarding clock and the input of the PLL-1 and the electrical path length between the input of the forwarding clock, the reference clock divider and the input of the PLL-2 should be well matched. In instances where it is difficult to match these path lengths using the paths' resistivity, a fixed or a programmable delay may be used. The purpose of the match is to ensure that the output clock generated by PLL-2 will have a known low skew phase and edge relationship with the output clock generated by PLL-1.

The PLL-2, in turn, provides the master slow clock for the slow clock domain. The generated clock feeds to a plurality of clock output ports which are tightly skew matched using, for example, the techniques described above. One of the clock output ports is fed back to a slow clock state machine 704 which will be described with respect to FIG. 10. However, one of its functions is to divide the slow clock into a feedback clock for the PLL-2. The feedback path is structured to nullify the insertion delays of the clocks that feed the PLL-3 (see FIG. 6). With fast clock speeds (for instance, exceeding 33 MHz), silicon skews due to process, voltage and temperature (PVT) and package skews are such that it may not be possible to find a common phase and edge relationship between two clock domains unless a "nulling out" of these skews are provided automatically. The characteristic of a phase-lock is to keep the generated output signal running at a locked phase and edge relationship with an inputted reference signal. The output frequency stability is determined by the stability of a reference oscillator, which is typically a voltage controlled oscillator (VCO). Once the VCO locks onto the reference signal, the feedback loop prevents it from drifting due to factors such as PVT. Along with wire delay balancing within the package and silicon, this uncertainty is removed. Therefore, PLL-2 and PLL-3 are in locked phase and edge relationship. Note that PLL1 and PLL2 are well matched and are also in phase and edge relationship. Stated differently, PLL-1, PLL-2 and PLL-3 are all in locked phase and edge relationship with each other.

The two D-flipflops in the fast clock domain 706, 708 and the two D-flip-flops in the slow clock domain 712, 714, which are essentially latches, control the data transfer from the fast clock domain to the slow clock domain and vice versa. Because PLL-1's clock feeds the D-flipflops 706, 708 in the fast clock domain and PLL-3's clock feeds the D-flipflops 712, 714 in the slow clock domain, which in turn is fed by the clock of the PLL-2, the D-flipflops 706, 708 in the fast clock domain and the D-flipflops 712, 714 in the slow clock domain have a fixed phase and edge relationship. To allow data to pass reliably between the D-flipflops 706, 708 in the fast clock domain and the D-flipflops 712, 714 in the slow clock domain, the fast clock state machine 702 and the slow clock state machine 704 provide for a fast to slow clock domain signal and a slow to fast clock domain signal, respectfully, which is now described.

Figure 8:
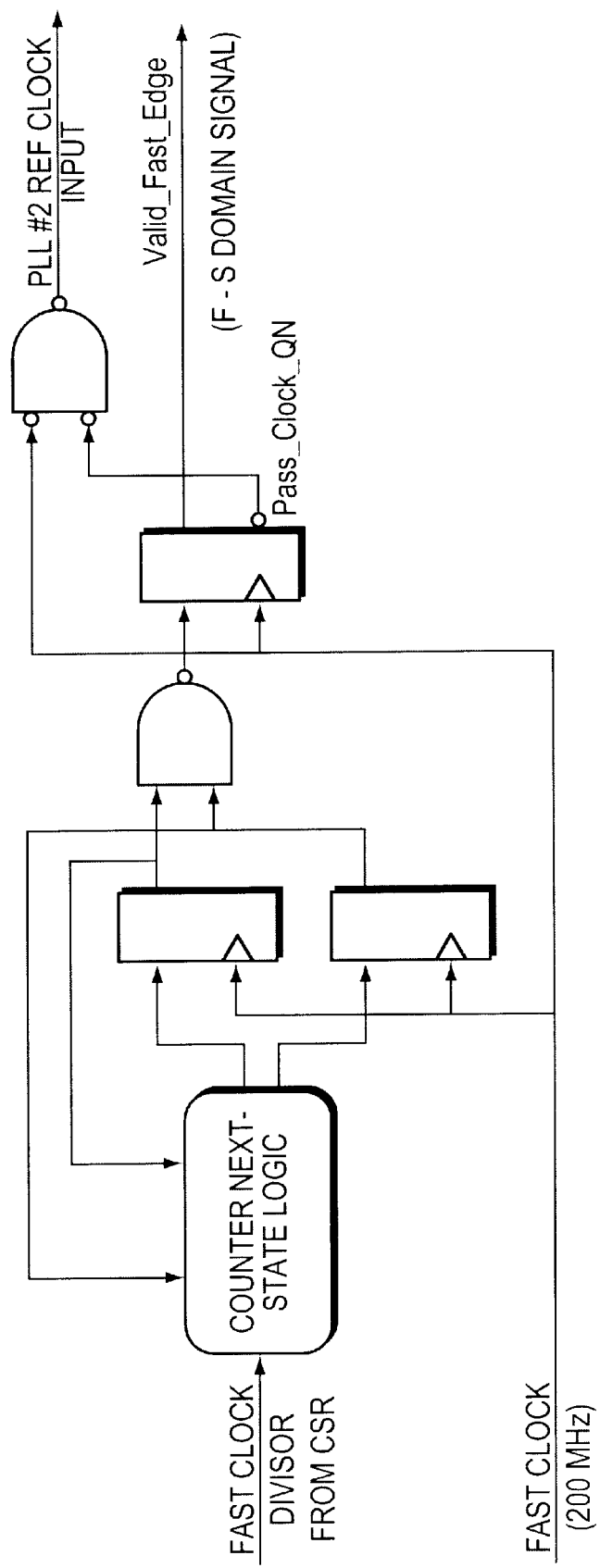
FIG. 8 is an illustrative diagram of a fast clock state machine.

FIG. 8 is an illustrative fast clock state machine 702 in accordance with an embodiment of the invention. The fast clock state machine includes a programmable divider (which in this instance is a counter) that divides the forwarding clock by 1, 2, or 3 (i.e., fast divisor, which may be stored in a register) depending upon the desired fast:slow clock ratio. The resulting output frequency is fed into PLL-2 as a reference clock. Table 1 lists examples of slow clocks that are generated depending on the speed of the fast clock and the programmed divisor along with its data transfer rate. Note that for data to cross the clock domains deterministically, data is allowed to cross on common clock edges, that is, when the rising edge of the fast and slow clocks line up. This alignment is ascertained by the fast clock state machine and slow clock state machine, which generates a fast to slow clock domain signal and a slow to fast clock domain signal respectively, in which data is permitted to pass through the flipflops. For instance, note that because the fast clock state machine 702 "knows" the divisor, the state machine is able to generate a fast to slow clock domain signal that indicates on which edge of the fast clock that data may be transferred to the slow clock domain.

TABLE 1

Example Frequencies

| Ratio | Fast Clock | Slow Clock | Data Transfer Rate | Fast Divisor | Slow Divisor |
|---|---|---|---|---|---|
| 1:1 | 133 MHz | 133 MHz | 133 MHz | 1 | 1 |
| 3:2 | 200 MHz | 133 MHz | 66 MHz | 3 | 2 |
| 2:1 | 200 MHz | 100 MHz | 100 MHz | 2 | 1 |
| 3:1 | 200 MHz | 66 MHz | 66 MHz | 3 | 1 |

Figure 9:
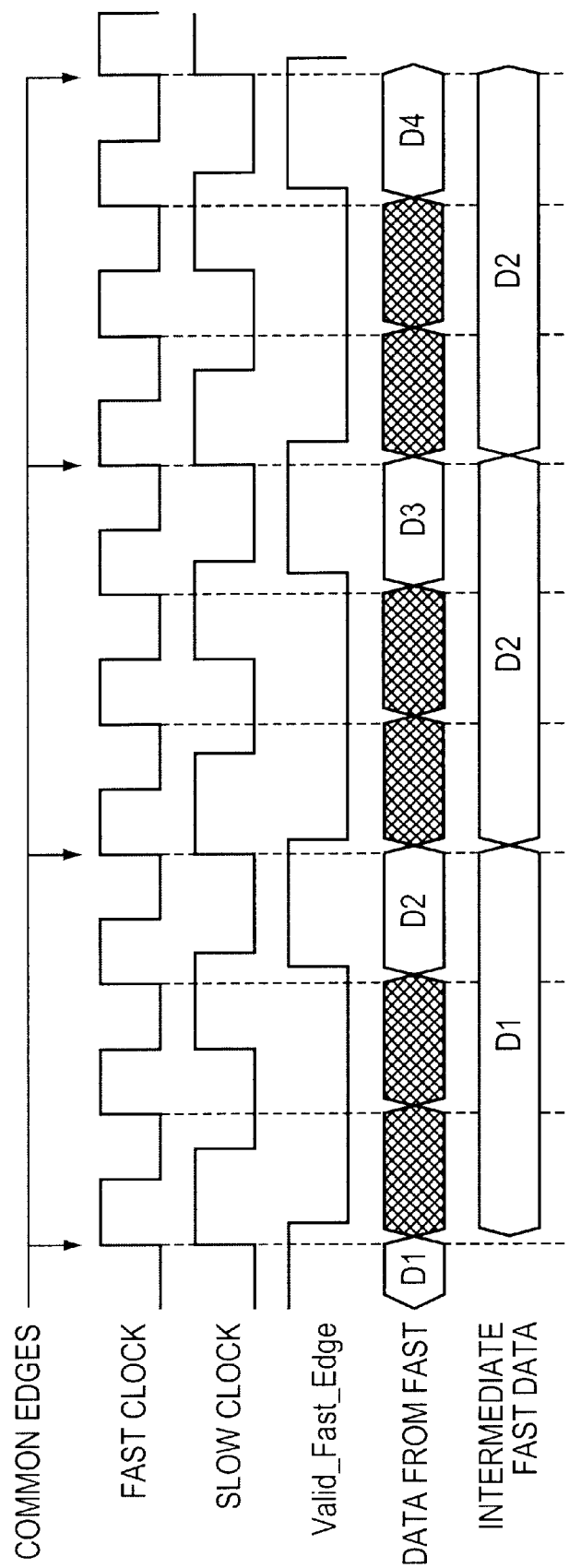
FIG. 9 shows timing diagrams of data crossing from fast to slow clock domains.

FIG. 9 shows the timing diagrams of the data crossing from fast to slow clock domains with a 3:2 clock ratio.

Figure 10:
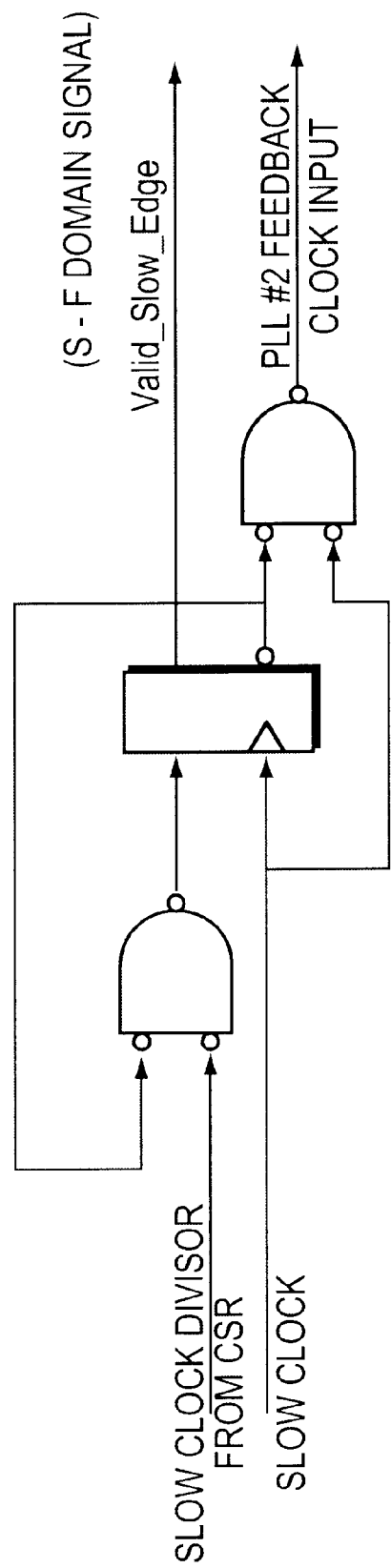
FIG. 10 is an illustrative diagram of a slow clock state machine.
Figure 11:
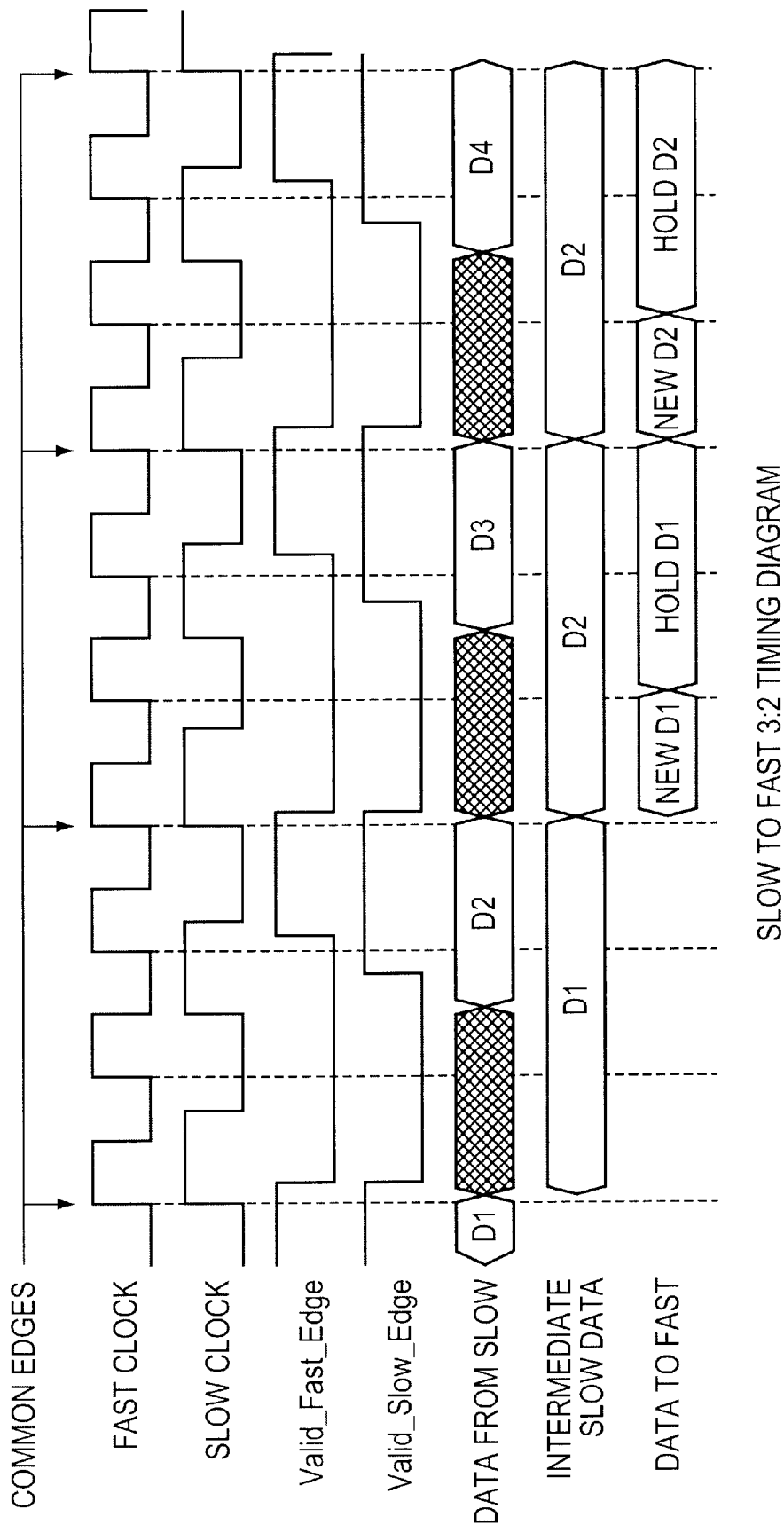
FIG. 11 shows timing diagrams of data crossing form slow to fast clock domains.

FIG. 10 is an illustrative slow clock state machine 704 in accordance with an embodiment of the invention. The slow clock state machine is a programmable divider that divides the master slow clock by either 1 or 2 (i.e., slow divisor which may be stored in a register). According to the embodiment, it generates a feedback clock in the range of 66 MHz to 133 MHz (see table 1). Because the slow clock state machine 704 knows the divisor, the state machine is able to generate a slow to fast domain signal that indicates on which edge of the slow clock data can be transferred to the fast clock domain. FIG. 11 shows the timing diagrams of the data crossing from slow to fast clock domains with a 3:2 clock ratio.

Providing a deterministic behavior between multiple clock domains through the novel use of a PLL has been described. It will however be apparent that other variations and modifications may be made to the described embodiments, with attainment of some or all of their advantages. Therefore, it is the object of the appended claims to cover all such variations and modifications within the true spirit and scope of the invention.

What is claimed is:

1. An apparatus to pass data between a fast clock domain and a slow clock domain comprising:

a first phase-locked loop (PLL) circuit to receive a first reference clock and to generate a first clock for the fast clock domain;

a first state machine to receive the first reference clock and a first divisor to generate a second reference clock, the first state machine further generates a fast to slow data transfer enable signal based on the first divisor;

a second PLL circuit to receive the second reference clock and to generate a second clock for the slow clock domain, the second clock placed in fixed phase and edge relationship with the first clock; and a second state machine to receive the second clock and a second divisor to generate a feedback clock for the second PLL circuit and to generate a slow to fast data transfer enable signal based on the second divisor.

2. The apparatus as in claim 1, further comprising:

a third PLL circuit to receive the second clock from the second PLL circuit to generate a third clock in the slow domain; and a latch circuit to receive the third clock and the slow to fast data transfer enable signal, wherein when the slow to fast transfer enable signal is enabled, the latch passes data from the slow to the fast clock domain.

3. The apparatus as in claim 1, further comprising:

a latch circuit to receive the first clock and the fast to slow data transfer enable signal, wherein when the fast to slow transfer enable signal is enabled, the latch passes data from the fast to the slow clock domain.

4. The apparatus as in claim 1, wherein the first state machine includes a counter to count to the received first divisor and on completion of the count, the counter generates the fast to slow transfer enable signal.

5. The apparatus as in claim 1, wherein the second state machine includes a counter to count to the received second divisor and on completion of the count, the counter generates the slow to fast transfer enable signal.

6. An apparatus to pass data between a fast clock domain and a slow clock domain comprising:

a first phase-locked loop (PLL) circuit to receive a first reference clock and to generate a first clock for the fast clock domain;

means for receiving the first reference clock and a first divisor to generate a second reference clock and further generating a fast to slow data transfer enable signal based on the first divisor;

a second PLL circuit to receive the second reference clock and to generate a second clock for the slow clock domain, the second clock placed in fixed phase relationship with the first clock; and means for receiving the second clock and a second divisor to generate a feedback clock for the second PLL circuit and to generate a slow to fast data transfer enable signal based on the second divisor.

7. A computer system to pass data between a fast clock domain and a slow clock domain comprising:

a processing unit to transmit a forwarding clock;

an input/output (I/O) bridge that includes,
a first phase-locked loop (PLL) circuit to receive the forwarding clock and to generate a first clock for the fast clock domain;
a first state machine to receive the forwarding clock and a first divisor to generate a reference clock, the first state machine further generates a fast to slow data transfer enable signal based on the first divisor;
a second PLL circuit to receive the reference clock and to generate a second clock for the slow clock domain, the second clock placed in fixed phase and edge relationship with the first clock; and
a second state machine to receive the second clock and a second divisor to generate a feedback clock for the second PLL circuit and to generate a slow to fast data transfer enable signal based on the second divisor.

8. The system as in claim 7, wherein the I/O bridge further comprises:

a third PLL circuit to receive the second clock from the second PLL circuit to generate a third clock in the slow domain; and a latch circuit to receive the third clock and the slow to fast data transfer enable signal, wherein when the slow to fast transfer enable signal is enabled, the latch passes data from the slow to the fast clock domain.

9. The system as in claim 7, wherein the I/O bridge further comprises:

a latch circuit to receive the first clock and the fast to slow data transfer enable signal, wherein when the fast to slow transfer enable signal is enabled, the latch passes data from the fast to the slow clock domain.

10. The system as in claim 7, wherein the first state machine includes a counter to count to the received first divisor and on completion of the count, the counter generates the fast to slow transfer enable signal.

11. The system as in claim 7, wherein the first state machine includes a counter to count to the received first divisor and on completion of the count, the counter generates the fast to slow transfer enable signal.

12. A method for passing data between a fast clock domain and a slow clock domain, the method comprising:

providing a first phase-locked loop (PLL) circuit to receive a first reference clock and to generate a first clock for the fast clock domain;

providing a first state machine to receive the first reference clock and a first divisor to generate a second reference clock, the first state machine further generates a fast to slow data transfer enable signal based on the first divisor;

providing a second PLL circuit to receive the second reference clock and to generate a second clock for the slow clock domain, the second clock placed in fixed phase and edge relationship with the first clock; and providing a second state machine to receive the second clock and a second divisor to generate a feedback clock for the second PLL circuit and to generate a slow to fast data transfer enable signal based on the second divisor.

13. The method as in claim 12, further comprising:

providing a third PLL circuit to receive the second clock from the second PLL circuit to generate a third clock in the slow domain; and providing a latch circuit to receive the third clock and the slow to fast data transfer enable signal, wherein when the slow to fast transfer enable signal is enabled, the latch passes data from the slow to the fast clock domain.

14. The method as in claim 12, further comprising:

providing a latch circuit to receive the first clock and the fast to slow data transfer enable signal, wherein when the fast to slow transfer enable signal is enabled, the latch passes data to the from the fast slow clock domain.

* * * * *